(12) United States Patent
Miska

(10) Patent No.: US 6,901,660 B2
(45) Date of Patent: Jun. 7, 2005

(54) METHOD FOR MAKING AN ABRASION RESISTANT CONDUCTIVE FILM AND GASKET

(75) Inventor: Stanley R. Miska, Pittsford, NY (US)

(73) Assignee: Schlegel Systems, Inc., Rochester, NY (US)

( * ) Notice: Subject to any disclaimer, the term of this patent is extended or adjusted under 35 U.S.C. 154(b) by 269 days.

(21) Appl. No.: 10/044,053

(22) Filed: Jan. 11, 2002

(65) Prior Publication Data

US 2002/0129494 A1 Sep. 19, 2002

Related U.S. Application Data

(62) Division of application No. 09/805,324, filed on Mar. 13, 2001, now Pat. No. 6,541,698.

(51) Int. Cl.[7] .............................. H05K 3/02; H05K 3/10
(52) U.S. Cl. ...................... 29/846; 29/830; 174/35 GC; 174/35 R; 277/920; 361/816; 361/818
(58) Field of Search .............. 29/830, 846; 174/35 GC, 174/35 R; 277/920; 361/816, 818

(56) References Cited

U.S. PATENT DOCUMENTS

| 3,833,951 A | | 9/1974 | Hurwitz |
| 4,816,124 A | | 3/1989 | Manabe et al. |
| 5,045,635 A | * | 9/1991 | Kaplo et al. ............ 174/35 GC |
| 5,656,795 A | * | 8/1997 | Miska .................... 174/35 GC |
| 5,674,606 A | | 10/1997 | Powers |
| 6,368,682 B1 | * | 4/2002 | Fong ........................... 428/1.5 |

FOREIGN PATENT DOCUMENTS

AU 645275 1/1994

* cited by examiner

Primary Examiner—Richard Chang
(74) Attorney, Agent, or Firm—Stephen B. Salai, Esq.; Donna P. Suchy, Esq.; Harter, Secrest & Emery LLP

(57) ABSTRACT

A method for making a conductive gasket for use in apparatus to block the exit or entry of electromagnetic interference (EMI) between adjacent metal surfaces of the apparatus. The gasket is formed at least in part by a polymeric film having an outward facing surface embossed so as to provide a plurality of peaks distributed over the surface. A metal is coated, by vapor deposition, onto the surface so as to over lie the peaks.

5 Claims, 2 Drawing Sheets

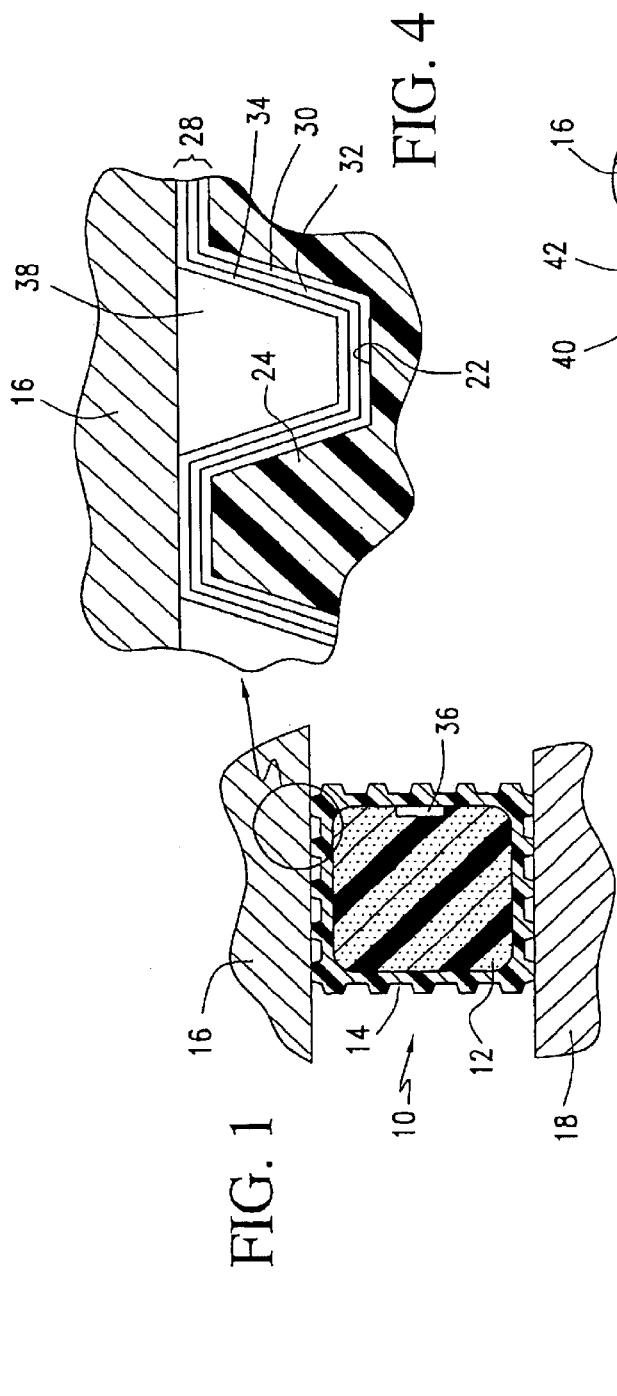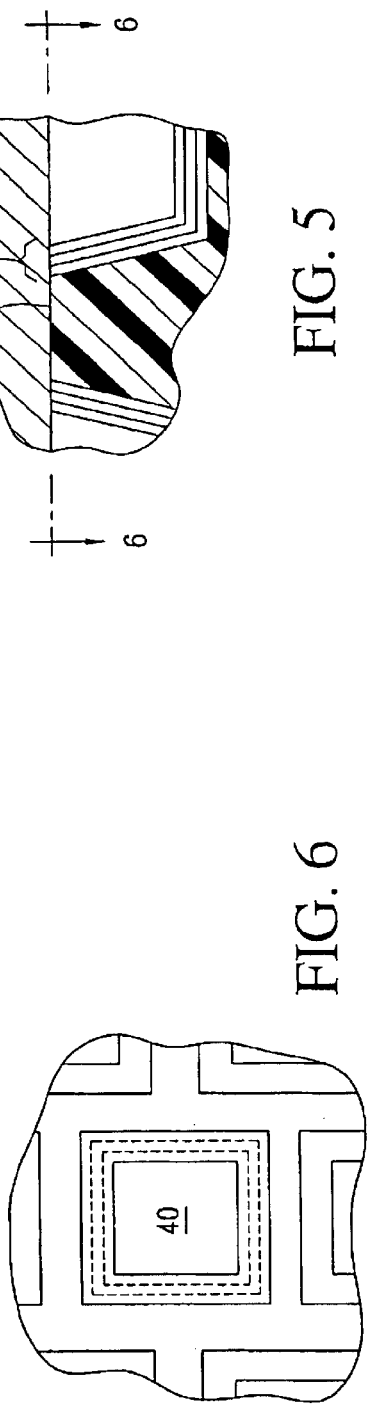

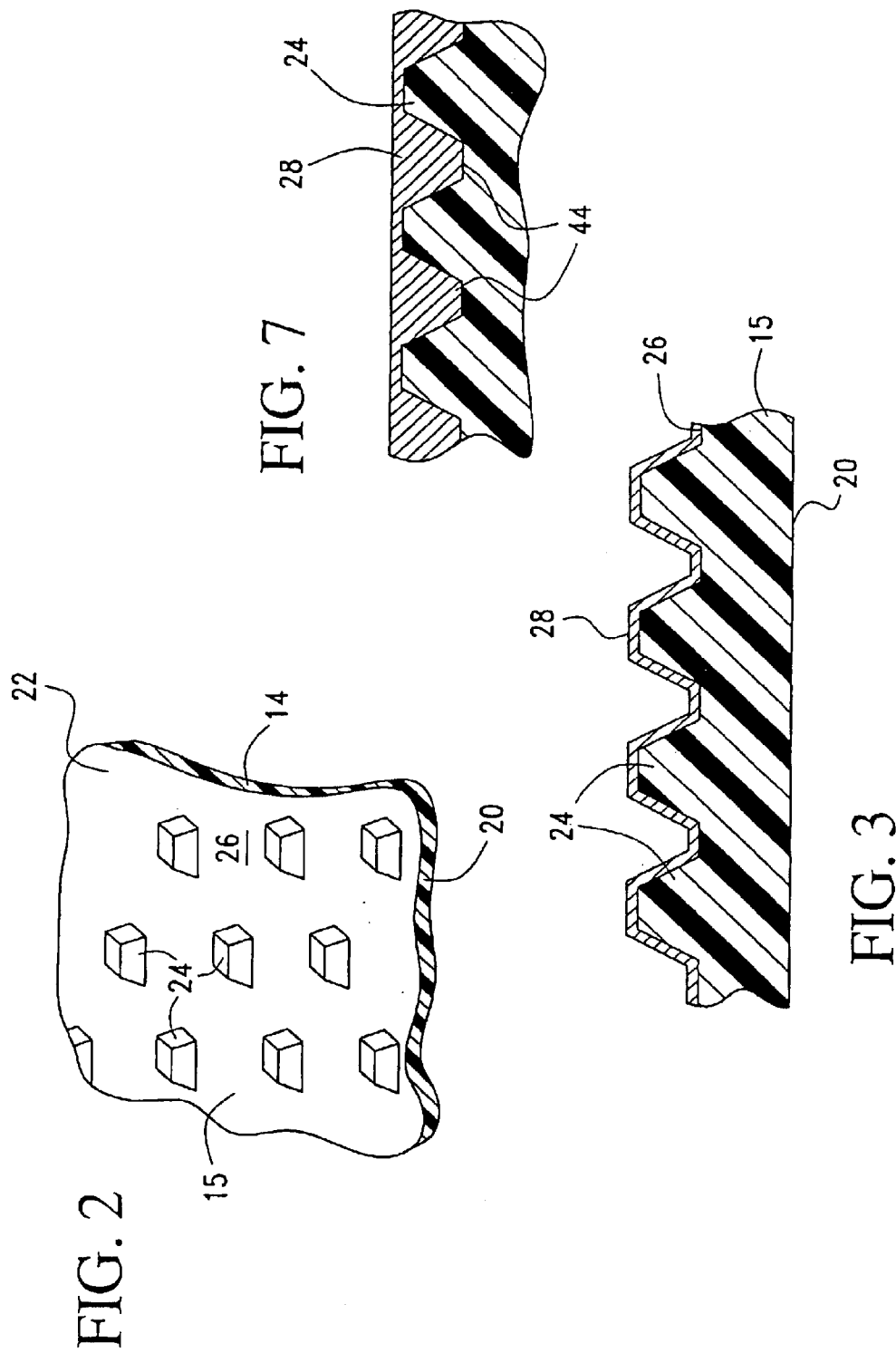

METHOD FOR MAKING AN ABRASION RESISTANT CONDUCTIVE FILM AND GASKET

CROSS REFERENCE TO RELATED APPLICATIONS

This application is a division of Ser. No. 09/805,324 filed Mar. 13, 2001, now U.S. Pat. No. 6,541,698.

TECHNICAL FIELD

The present invention relates to a method for making an abrasion resistant conductive film and more particularly to such a film having utility as a component of a conductive gasket for electrical apparatus to block the entry or exit of electromagnetic interference (EMI) and radio frequency interference (RFI) through openings in the apparatus.

BACKGROUND OF THE INVENTION

Many modern electronic devices emit or are sensitive to electromagnetic interference (EMI) at high frequencies. Electromagnetic interference is understood to mean undesired conducted or radiated electrical disturbances from an electric or electronic apparatus, including transients, which can interfere with the operation of other electrical or electronic apparatus. Such disturbances can occur anywhere in the electromagnetic spectrum. Radio frequency interference (RFI) refers to disturbances in the radio frequency portion of the spectrum but often is used interchangeably with electromagnetic interference. Both electromagnetic and radio frequency interference are referred to hereafter as EMI.

Many electronic devices, for example, cell phones, computers, various radio frequency and microwave devices, among others, are sources of EMI. These devices not only are sources of EMI, but also the operation of such devices may be adversely affected by the emission of EMI from other sources. Consequently, electric or electronic apparatus susceptible to electromagnetic interference or apparatus likely to generate electromagnetic generally must be shielded in order to operate properly.

The shield generally is any metallic or electrically conductive configuration inserted between a source of EMI and a desired area of protection wherein the shield is capable of absorbing and/or reflecting the EMI. As a practical matter, such shields normally take the form of an electrically conductive housing or cabinet, which is electrically grounded. The shield, in any event, prevents both the radiation of EMI from a source and/or prevents such interference (either generated randomly or by design) from reaching a target within the shielded volume.

A shield comprising a metal cabinet often includes an opening for access to the electronics within the cabinet with a door or other removable cover closing the access opening. Any gap between the confronting, abutting or mating metal surfaces of the cabinet and closure afford an opportunity for the passage of electromagnetic interference. Gaps also interfere with electrical currents running along the surfaces of the cabinets from EMI energy which is absorbed and is being conducted to ground. The gaps reduce the efficiency of the ground conduction path and may even result in the shield becoming a secondary source of EMI leakage from gaps acting as slot antennae. Accordingly, it is common to use a conductive seal or gasket between such surfaces to block the passage of EMI.

Various configurations of gaskets have been developed to close the gaps between components of the shield. These gaskets establish as continuous a conductive path as possible across any gap that may exist, for example, between cabinet components. A common gasket employs a flexible core enclosed in a woven fabric made at least in part with conductive fibers. Examples of such fabrics are disclosed in U.S. Pat. No. 4,684,762. Another common gasket construction as disclosed, for example, in U.S. Pat. Nos. 4,857,668, and 5,597,979 has a flexible core enclosed in an electrically conductive sheath formed of a non-conducting woven or non-woven fabric. The fabric is rendered conductive by an electroless plating process wherein the fabric is dipped in a silver nitrate bath to impregnate the fabric with silver. In an alternative process, the conductive material including silver or copper may be applied by sputter deposition. After impregnation or coating with silver, the fabric is coated with a non-corrosive material to prevent the oxidation of the silver surface. Suitable coating materials applied either by electroplating or sputter deposition include a pure metal such a nickel or tin, a metal alloy such as Inconel® or Nichrome® or a carbon compound.

In addition to being conductive, the gasket also must have a degree of abrasion resistance. Resistance to abrasion is important as any wearing away of the conductive surface can result in loss of the EMI shield. Abrasion and erosion of the conductive surface occurs in response to the movement and flexing of the cabinet in which the electronic apparatus is contained and some abrasion occurs each time the door or closure is removed and replaced as may occur when the electronics are serviced.

While gaskets formed of a metalized fabric have been acceptable, the multiple steps required to manufacture such gaskets adds considerably to the cost of the gasket. Metalized films of a polymeric material also have been used as a sheathing material and in general, the manufacture of a conductive gasket from a metalized film involves fewer process steps. However, metalized films generally are not as abrasion resistant as a conductive fabric of a woven or non-woven material. In particular, when a metalized film is used as a conductive media for EMI gaskets, even low levels of abrasion that erodes the metal layer will adversely affect the surface conductivity and permit passage of EMI.

Accordingly, an object of the present invention is to provide an improved conductive gasket for use in sealing gaps between adjacent surfaces of a shielding housing for electric or electronic apparatus to isolate the electric or electronic device within the housing from EMI.

Another object of the invention is to provide an EMI gasket formed in part from a metalized polymeric film.

A further object of the present invention is to provide an abrasion resistant EMI gasket formed in part of a metalized polymeric film.

A still further object of the present invention is to provide an EMI gasket having a resilient core enclosed in an abrasion resistant metalized polymeric film.

SUMMARY OF THE INVENTION

In the present invention, a gasket having electromagnetic interference (EMI) shielding properties is provided for disposition between adjacent metal surfaces to block the entry or exit of electromagnetic radiation from between the adjacent metals surfaces. The gasket includes a resilient core member. The core may be composed of any suitable conductive or non-conductive material and preferably is formed of closed cell urethane foam. Surrounding the core is a polymeric film. The film has a reverse side in intimate contact with the core and an outward facing obverse side.

The obverse side is embossed so as to form a plurality of peaks rising above the plane surface of the film. A conductive metal layer coats the obverse side and extends over both the peaks and plane surface.

In use, the gasket is disposed in the gap between adjacent metal surfaces of the shielded housing. At least one of these surfaces bears against the peaks on the gasket surface to form a conductive circuit across the gap. Over time, relative movement of the adjacent metal surfaces may abrade the metal coating from the peaks on the surface of the gasket. Abrasion wears metal from the summit of the peaks and exposes a thickness of coating on the sides of the peaks. The exposed thickness of coating remains in contact with the adjacent metal surfaces, which in turn maintains the conductivity of the gasket across the gap. The worn peaks inhibit further wear of the coating on the side surfaces.

Accordingly, the present invention may be characterized in one aspect thereof by a gasket having electromagnetic interference properties for disposition between adjacent metal components comprising:

a) a resilient core;

b) a conductive sheath surrounding the resilient core;

c) the conductive sheath being formed of a non conducting polymeric film having a reverse surface in contact with the resilient core and an obverse surface facing outward from the core, the obverse surface being embossed to provide a plurality of peaks standing above the plane surface of the film; and d) a conductive metal coating overlying the peaks and the plane surface whereby the EMI shield provided by the gasket is unaffected by erosion of the metal coating from the tops of each peak.

DESCRIPTION OF THE DRAWINGS

FIG. 1 is a cross sectional view of the gasket of the present invention shown disposed between adjacent metal surfaces;

FIG. 2 is a perspective view of the sheath material for use in the gasket of FIG. 1;

FIG. 3 is a cross sectional view on an enlarged scale of the sheath material of FIG. 1;

FIG. 4 is a view on an enlarged scale of a portion of FIG. 1;

FIG. 5 is a view similar to FIG. 4 shown at a later time;

FIG. 6 is a view taken along lines 6—6 of FIG. 5; and

FIG. 7 is a view similar to FIG. 3 showing another embodiment of the invention.

DETAILED DESCRIPTION OF THE INVENTION

Referring to the drawings, FIG. 1 shows a conductive gasket of the present invention generally indicated at 10. The gasket comprises a continuously molded foam core 12, which is resilient and compliant over a range of temperatures and which preferably exhibits good compression set characteristics such that the material will "spring back" after repeated compression and decompression and even after long periods of compression. For example, a suitable material for core 12 is closed cell urethane foam.

Surrounding the core 12 is a sheath 14. The sheath preferably is composed of a polymeric material, as set out herein below, that is metalized to render the sheath conductive. The gasket 10, when positioned between adjacent metal surfaces 16,18 provides a conductive path between the surfaces to form an EMI shield.

As seen in FIG. 2, the sheath 14 is composed of a polymeric film 15 having a reverse side 20 and an obverse side 22. The polymeric film may be formed of any suitable polymer including, but not limited to, nylon, low-density linear polyethylene or an oriented polypropylene. The thickness of the film may be as thin as 0.5 mils or as thick as 100 mils or more provided that the structure maintains its integrity as it is bent or shaped to conform to the core material. The polymeric film preferably contains a flame-retardant material and generally is non-conductive. However, films may be carbon filled or include metal fillers so the film is conductive.

The obverse side 22 of the film is embossed so as to form a plurality of peaks 24 upstanding from the plane surface 26 of the film obverse side 22. In the case of a relatively thin film, the process of embossing the obverse side may also cause a pattern to form on the reverse side 20. This is not the case with a thicker film or where the film is laid against a flat backing during the embossing process. A suitable film has been found to be an embossed film of linear low-density polyethylene identified as XEM-856.2-65 sold by Pliant Corporation. This film is a 4-mil film and is embossed on one side with a pattern of flat-topped four-sided pyramids. The height of the pyramids (peaks 24) is about one-fourth the film thickness or about 1 mil. The peaks are distributed across the film surface at a density of about 165 per square inch so as to create a pattern of peaks and valleys on the obverse side 22 of the film. This film as supplied by Pliant Corporation includes a flame-retardant so the film has flame resistance properties.

The polymeric film itself is non-conductive. To render the film conductive, the obverse side 22 is coated with a conductive metal. In this respect, FIG. 3 shows the film as including a coating 28 extending over the peaks 24. The coating 28 includes one or more conductive metal layers applied, preferably, by vapor deposition. Vapor deposition is a process well known in the art. Given the thickness of the film and thickness of the coating 28 it should be appreciated that none of the Figures is to scale and the thickness of both the film and coating have been exaggerated for clarity. In particular, the coating thickness is from 100 Å to 5000 Å thick and preferably is about 3000 Å.

As best seen in FIG. 4, the coating 28 may comprise a single layer but preferably includes at least three metallic layers. A first adherence layer 30 is deposited directly onto the obverse side 22 of the film. This layer preferably is Nichrome but can be any other metal or alloy such as chrome, Inconel or titanium among others having the property of adhering both to the film substrate and to the second layer 32. The second layer 32 is the conductive layer of the film and can be any highly conductive metal such as copper, gold, silver or platinum with silver being preferred. A third and surface layer 34 is deposited over the conductive layer for abrasion resistance and in the case of silver, to prevent oxidation of the silver layer.

Since the surfaces adjacent the gasket are very likely to be of a dissimilar metal, the accelerated oxidation of the silver layer on the gasket by galvanic action also is a concern. A surface layer 34 of a pure metal such as nickel, aluminum, iron, tin or zirconium or an alloy such as Nichrome or an Inconel will provide protection against galvanic action, be abrasion resistant and provide a conductive surface. An alloy such as Inconel 600 is preferred. All three metal layers may be deposited in sequence by vapor deposition which facilitates forming the conductive sheath as opposed to the multi step process of forming a metalized sheath of a woven or non woven fabric.

Abrasion resistance, corrosion resistance and galvanic compatibility also are provided by a thin outer coating of an organic material such as an acrylic, polyurethane, polyester or polycarbonate among others. Even though these materials are non-conductive, a thin layer will provide the desired protection without materially decreasing the conductivity of the metal layer beneath. It further is possible to improve the shielding effectiveness of the film by adding any of the organic materials noted above, among others, as a thin dielectric layer between additional metal layers to provide capacitance coupling. For example, a silver layer, a dielectric and a second silver layer may be applied to the film in a sequence of vapor deposition steps. Metalizing both sides of the polymeric film also will provide dielectric properties. Accordingly, it should be appreciated that the layer 28 also may include one or more layers of a non-metal to provide dielectric properties or to provide other desirable properties including adherence to the film. Any number of layers can be built up by vapor deposition provided the materials are selected so that adjacent layers adhere one to another.

The conductive sheath 14 is secured about the resilient core 12 by any suitable adhesive process. For example the surface of the core may be provided with an adhesive property so as to bond to the reverse side of the sheath. As an alternative a separate adhesive such as a layer of adhesive may be used or the sheath may be secured in position using an adhesive tape 36 (FIG. 1) to join abutting or overlapping edges of the sheath.

The gasket 10 of the present invention is disposed for use between adjacent metal surfaces 16, 18 which may be, for example, a cabinet and a door or closure for an access opening into the cabinet. The gasket 10, and particularly the outer metalized surface of the gasket, defines a conductive path between the adjacent surfaces 16,18 as shown in FIG. 4. The conductive path is established by direct contact of the adjacent surface 16 (and 18) with the metal layer 28 extending over the tops of the peaks 24. In this fashion, EMI is prevented from passing between the surfaces 16,18. No appreciable gap exists between the gasket and the adjacent surfaces to allow the passage of EMI. This is because of the disposition of the embossed peaks in a staggered pattern over the obverse side 22 of the polymeric film. Thus the spaces 38 between peaks as shown in FIG. 4 are blocked by peaks (not shown) both fore and aft of the vertical plane illustrated in FIG. 4.

Over time, there is relative movement between the metal surfaces 16,18 and the gasket 10 for several reasons such as for example temperature changes, flexing of the metal components during movement from one location to another or opening and closing of the closure. Such relative movement over time causes the erosion of the metal coating from the tops of the peaks 24. Erosion of the metal layer from the plane surface of a smooth film would break the conductive path over the surface of the gasket and possibly compromise the EMI shielding. In the present invention however, erosion of the metal layer from the top of the peaks 24 does not compromise the EMI shield.

As shown in FIGS. 5 and 6 the erosion of metal to expose the non conductive surface 40 at the top of the peaks exposes a cross section 42 of thin layer of the metal coating on the sides of the peaks. This cross section continues to make a conductive contact around each peak with the adjacent metal surfaces 16,18 to maintain the integrity of the EMI shield even after the coating on the top surface is gone. Accordingly, abrasion of the metal surface of the gasket of the present invention does not compromise the EMI shield.

As noted above, embossing the film to provide peaks with sloped sides is preferred as this configuration presents a larger metal surface to contact as the conductive surface at the top of the peaks is worn away through abrasion. However, the shape of the peaks may be of any suitable configuration. For example the peaks could take the shape of a right-sided cylinder or a truncated cone or pyramid. A flat top, while preferred, is not essential and the peak may have a pointed top such as a true cone or pyramid.

Embossing the film should provide a pattern and distribution of peaks that avoids any line-of-sight path between the peaks from one side of the gasket to the other. Otherwise a gap could be created which may pass the EMI. As noted above a preferred arrangement is to have the peaks in the form of a four-sided pyramid having a flat truncated top distributed over the film surface wherein the density of the peaks is about $165/in^2$. Another embodiment as shown in FIG. 7 is to provide a coating 28 that completely covers the peaks 24 and fills the valleys 44 between the peaks. While this embodiment uses a greater quantity of metal, a greater cross section of metal is exposed and remains in contact with the adjacent surfaces when the coating is worn from the tops of the peaks. Filling the valleys with the metal containing coating also is another way of avoiding gaps between the peaks that might accommodate the passage of EMI and thus compromise the shield.

In yet another embodiment, it is possible to eliminate the resilient core 12 and have the metalized film itself comprise the gasket. This can be accomplished by folding the film so that the reverse faces are butted one against the other exposing the metalized obverse side around the entire outer periphery. In the case of a relatively thick film, embossing both sides of the film, cutting the film into thin strips and then metalizing all faces of the thin strip also can eliminate the core.

Thus, it should be appreciated that the present invention accomplishes its objects in providing an abrasion resistant conductive gasket for use in sealing gaps between adjacent surfaces of a shielding housing for electric or electronic apparatus to isolate the electric or electronic device within the housing from EMI. The gasket is formed in total or in part from a metalized polymeric film wherein the conducting surface of the film is embossed to provide a plurality of peaks standing above the plane surface of the film. With this arrangement, any abrasion that may wear conductive metal coating from the tops of the peaks does not compromise the conductive surface of the film in that such abrasion also will expose a cross section of the conductive metal at the sides of the peaks.

Having described the invention in detail, what is claimed as new is:

1. A method of forming a conductive abrasion resistant gasket having electromagnetic interference properties for disposition between adjacent conductive metal surfaces comprising the steps of:
   a) providing a polymeric film having a reverse side and an obverse side;
   b) embossing at least the obverse side so as to provide it with a plurality of peaks which upstand from the plane surface of the obverse side, at least one peak characterized by opposed outwardly sloping sides that converge towards a generally flat top; and
   c) vapor depositing a conductive metal coating onto the obverse side that over lays the peaks and the plane surface of the obverse side so as to form a conductive film for disposition as a gasket between the adjacent conductive metal surfaces and said gasket being unaffected by abrasion of the metal coating from the top of said at least one peak by maintaining contact between the coating on the opposed outwardly sloping sides and the adjacent conductive metal surface.

2. A method as in claim 1 comprising:
   a) providing a resilient core; and
   b) enclosing the core in said conductive film with the obverse side of the film facing outward.

3. A method of forming a conductive abrasion resistant gasket having electromagnetic interference properties for disposition between adjacent conductive metal surfaces comprising the steps of:
   a) providing a polymeric film having a reverse side and an obverse side;
   b) embossing at least the obverse side so as to provide it with a plurality of peaks which upstand from the plane surface of the obverse side; and
   c) vapor depositing a conductive metal coating onto the obverse side that over lays the peaks and the plane surface of the obverse side so as to form a conductive film for disposition as a gasket between the adjacent conductive metal surfaces and said gasket being unaffected by erosion of the metal coating from the tops of said peaks; and comprising vapor depositing onto the obverse side of the film in sequence:
   a) a first metal as an adhesive layer on the obverse side of the film;
   b) a second metal onto the first layer, the second layer being an a conductive layer; and
   c) a third metal layer onto the second layer, the third layer being an abrasion and anti corrosion layer.

4. A method of forming a conductive abrasion resistant gasket having electromagnetic interference properties for disposition between adjacent conductive metal surfaces comprising the steps of:
   a) providing a polymeric film having a reverse side and an obverse side;
   b) embossing at least the obverse side so as to provide it with a plurality of peaks which upstand from the plane surface of the obverse side; and
   c) vapor depositing a conductive metal coating onto the obverse side that over lays the peaks and the plane surface of the obverse side so as to form a conductive film for disposition as a gasket between the adjacent conductive metal surfaces and said gasket being unaffected by erosion of the metal coating from the tops of said peaks; and comprising vapor depositing onto the obverse side of the film at least three layers including a layer of a conductive metal disposed between inner and outer layers.

5. A method as in claim 4 comprising vapor depositing at least one of the inner and outer layers is a non metal.

* * * * *